(12) United States Patent
Noguchi

(10) Patent No.: US 10,998,335 B2
(45) Date of Patent: May 4, 2021

(54) SEMICONDUCTOR DEVICE INCLUDING A PASSIVATION FILM AND MULTIPLE WORD LINES

(71) Applicant: TOSHIBA MEMORY CORPORATION, Minato-ku (JP)

(72) Inventor: Hiroshi Noguchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/564,673

(22) Filed: Sep. 9, 2019

(65) Prior Publication Data
US 2020/0286913 A1    Sep. 10, 2020

(30) Foreign Application Priority Data

Mar. 5, 2019   (JP) .............................. JP2019-039813

(51) Int. Cl.
*H01L 27/11582* (2017.01)
*H01L 23/29* (2006.01)
*H01L 23/31* (2006.01)
*H01L 27/11573* (2017.01)

(52) U.S. Cl.
CPC ...... *H01L 27/11582* (2013.01); *H01L 23/291* (2013.01); *H01L 23/3171* (2013.01); *H01L 27/11573* (2013.01)

(58) Field of Classification Search
CPC ............. H01L 27/11582; H01L 23/291; H01L 23/3171; H01L 27/11573
See application file for complete search history.

(56) References Cited

U.S. PATENT DOCUMENTS

| 5,880,518 | A | 3/1999 | Oda et al. | |
|---|---|---|---|---|
| 7,718,520 | B2* | 5/2010 | Park | H01L 29/66628 438/586 |
| 2009/0026475 | A1* | 1/2009 | Yamaguchi | H01L 33/42 257/98 |
| 2009/0102012 | A1* | 4/2009 | Ha | H01L 27/0635 257/511 |
| 2017/0317217 | A1* | 11/2017 | Ito | H01L 21/0234 |

FOREIGN PATENT DOCUMENTS

| JP | 5-291582 A | 11/1993 |
|---|---|---|
| JP | 10-92810 A | 4/1998 |
| JP | 3459355 B2 | 10/2003 |
| JP | 2008-244032 A | 10/2008 |

* cited by examiner

*Primary Examiner* — David Lam
(74) *Attorney, Agent, or Firm* — Oblon, McClelland, Maier & Neustadt, L.L.P.

(57) ABSTRACT

A semiconductor device according to an embodiment includes a semiconductor substrate, a plurality of conductive layers extending in a first direction on the semiconductor substrate, and laminated in a third direction perpendicular to the first direction and a second direction at intervals in the second direction perpendicular to the first direction, and a passivation film which has several layers provided above the plurality of conductive layers. The passivation film has a first nitride film provided above the plurality of conductive layers, and a second nitride film provided on the first nitride film, and the second nitride film has the concave and convex shape which is repeated along the second direction.

4 Claims, 5 Drawing Sheets

US 10,998,335 B2

SEMICONDUCTOR DEVICE INCLUDING A PASSIVATION FILM AND MULTIPLE WORD LINES

CROSS-REFERENCE TO RELATED APPLICATIONS

This application is based upon and claims the benefit of priority from Japanese Patent Application No. 2019-039813, filed on Mar. 5, 2019; the entire contents of which are incorporated herein by reference.

FIELD

Embodiments of the present invention relate to a semiconductor device.

BACKGROUND

In a semiconductor storage device which is one of semiconductor devices, many word lines are arranged on one chip. Therefore, there is a case where an amount of warpage of a word line, particularly, in a length direction relatively increases.

DETAILED DESCRIPTION

Embodiments will now be explained with reference to the accompanying drawings. The present invention is not limited to the embodiments.

A semiconductor device according to an embodiment includes a semiconductor substrate, a plurality of conductive layers extending in a first direction on the semiconductor substrate, and laminated in a third direction perpendicular to the first direction and a second direction at intervals in the second direction perpendicular to the first direction, and a passivation film which has several layers provided above the plurality of conductive layers. The passivation film has a first nitride film provided above the plurality of conductive layers, and a second nitride film provided on the first nitride film, and the second nitride film has the concave and convex shape which is repeated along the second direction.

First Embodiment

Figure 1:
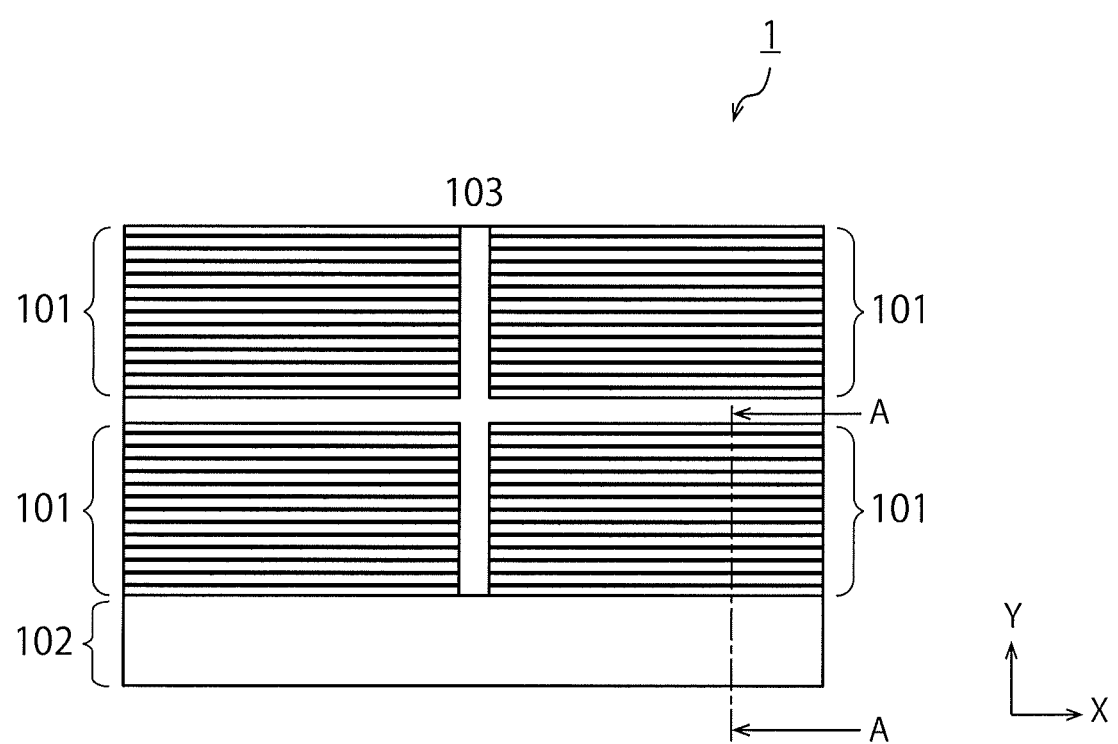
FIG. 1 is a plan view of a semiconductor device according to a first embodiment.
Figure 2:
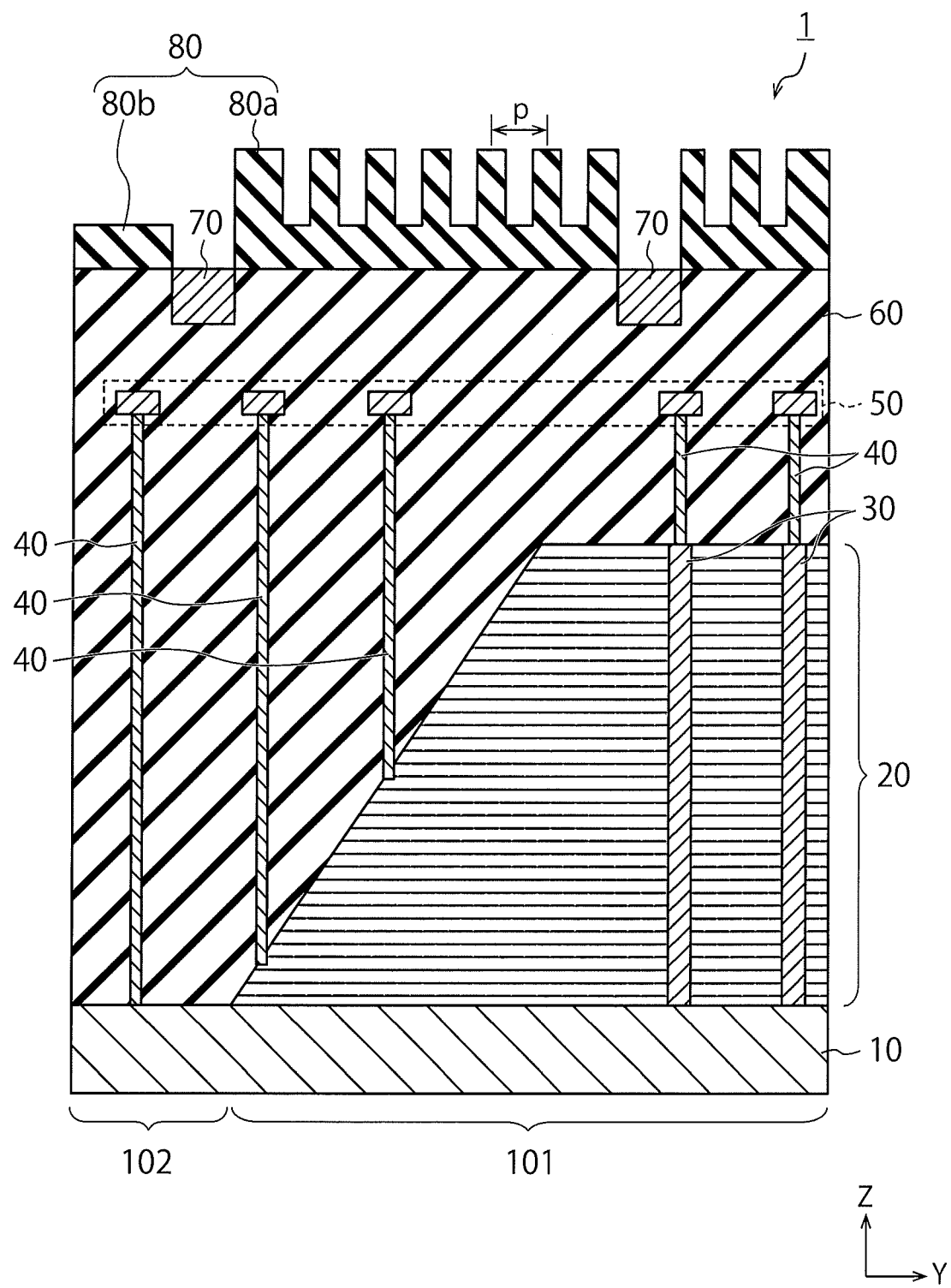
FIG. 2 is a cross-sectional view cut along a line A-A illustrated in FIG. 1.

FIG. 1 is a plan view of a semiconductor device according to a first embodiment. Further, FIG. 2 is a cross-sectional view cut along a line A-A illustrated in FIG. 1. The semiconductor device 1 illustrated in FIG. 1 and FIG. 2 is a three-dimensional multilayer semiconductor storage device in which memory cells are laminated.

As illustrated in FIG. 1 and FIG. 2, the semiconductor device 1 according to the present embodiment includes a semiconductor substrate 10, a laminated body 20, a memory film 30, contacts 40, wirings 50, an interlayer dielectric 60, pads 70 and a passivation film 80.

The semiconductor substrate 10 is, for example, a silicon substrate. The semiconductor substrate 10 is separated into a plurality of cell regions 101 and a peripheral circuit region 102. Further, the plurality of cell regions 101 are separated by a slit insulating film 103.

In the present embodiment, as illustrated in FIG. 1, four cell regions 101 are formed on one chip so that two cell regions 101 are formed in an X direction, and two cell regions 101 are formed in a Y direction. The number of cell regions 101 is not particularly limited. Further, while the peripheral circuit region 102 is adjacent to the cell regions 101 in the Y direction, the peripheral circuit region 102 may be adjacent in the X direction.

Figure 3:
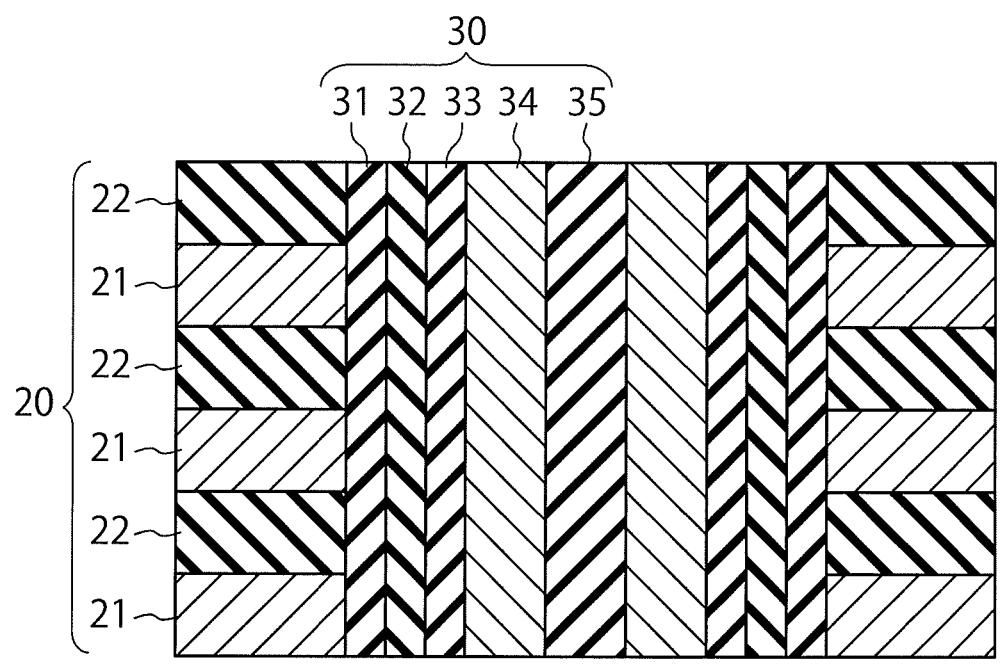
FIG. 3 is a cross-sectional view illustrating a configuration of part of a laminated body and a memory film.

FIG. 3 is a cross-sectional view illustrating a configuration of part of the laminated body 20 and the memory film 30. Structures of the laminated body 20 and the memory film 30 will be described below with reference to FIG. 1 to FIG. 3.

As illustrated in FIG. 2, the laminated body 20 is provided in the cell region 101. Further, an end portion of the laminated body 20 is formed in a step-like shape. In the laminated body 20, a plurality of conductive layers 21 and a plurality of insulating layers 22 are alternately laminated in a Z direction. As illustrated in FIG. 1, the plurality of conductive layers 21 extend in the X direction and are arranged at intervals in the Y direction. The conductive layers 21 are formed with a metal such as, for example, tungsten, and are word lines disposed opposite to the memory film 30. Each insulating layer 22 is, for example, a silicon oxide film.

Note that, concerning definition of directions, in the present embodiment, the X direction corresponds to a first direction which is a length direction of the conductive layer 21, and the Y direction corresponds to a second direction orthogonal to the X direction. Further, the Z direction corresponds to a third direction orthogonal to the X direction and the Y direction. In other words, the X direction and the Y direction are directions parallel to the semiconductor substrate 10, and the Z direction is a direction perpendicular to the semiconductor substrate 10.

As illustrated in FIG. 3, the memory film 30 penetrates through the laminated body 20, and includes a block insulating film 31, a charge storage layer 32, a tunnel insulating film 33, a channel layer 34, and a core insulating film 35. The charge storage layer 32 is, for example, a nitride silicon film, and is formed on a side face of the conductive layer 21 and the insulating layer 22 via the block insulating film 31. The channel layer 34 is, for example, a silicon layer, and is formed on a side face of the charge storage layer 32 via the tunnel insulating film 33. Note that the block insulating film 31, the tunnel insulating film 33 and the core insulating film 35 are, for example, oxide silicon films.

As illustrated in FIG. 2, each contact 40 is a conductor extending in the Z direction. Each wiring 50 is electrically connected to the conductive layer 21, the channel layer 34, a transistor (not illustrated) provided in the peripheral circuit region 102, or the like, via each contact 40.

The laminated body 20, the contacts 40 and the wirings 50 are covered with the interlayer dielectric 60. The interlayer dielectric 60 is, for example, an oxide silicon film. Upper faces of the pads 70 are exposed from the interlayer dielectric 60. A bonding wire (not illustrated) is bonded to the pads 70. Note that, because a structure of the semiconductor device 1 is simplified in FIG. 2, the respective numbers of the contacts 40, the wirings 50 and the pads 70 are smaller than the actual numbers.

The passivation film 80 is provided in an uppermost layer of the semiconductor device 1. As illustrated in FIG. 2, the passivation film 80 has a first portion 80a provided in the cell regions 101, and a second portion 80b provided in the peripheral circuit region 102. The first portion 80a and the second portion 80b are, for example, nitride silicon films.

The first portion 80a has a concave and convex shape in which a convex portion and a concave portion are repeated in the Y direction. In the first portion 80a, each convex portion is provided above the conductive layer 21 extending in the Y direction, and each concave portion is provided between the conductive layers 21. By this means, a difference in volume occurs between in the X direction and in the Y direction in the first portion 80a. Therefore, warpage in the X direction due to the conductive layer 21 is suppressed by the first portion 80a.

Note that, in the present embodiment, a central pitch P of the convex portion in the Y direction is the same as a pitch of the conductive layer 21 in the Y direction. However, the central pitch P may be greater than the pitch of the conductive layer 21. In other words, one convex portion may be formed for a plurality of conductive layers 21 arranged in the Y direction.

Meanwhile, while a peripheral circuit having a transistor, or the like, which drives the memory film 30 is provided in the peripheral circuit region 102, the conductive layer 21 extending in the X direction is not provided. Therefore, if a concave and convex shape is repeated in the second portion 80b in a similar manner to the first portion 80a, the peripheral circuit region 102 is inversely more likely to be warped.

Therefore, in the present embodiment, the second portion 80b is a flat film. That is, the second portion 80b of the passivation film 80 provided in the peripheral circuit region 102 does not have a difference in volume between in the X direction and in the Y direction. Therefore, in the peripheral circuit region 102, warpage is suppressed by the second portion 80b.

An example of a method for manufacturing the passivation film 80 will be described below with reference to FIG. 4A to FIG. 4C.

Figure 4A:
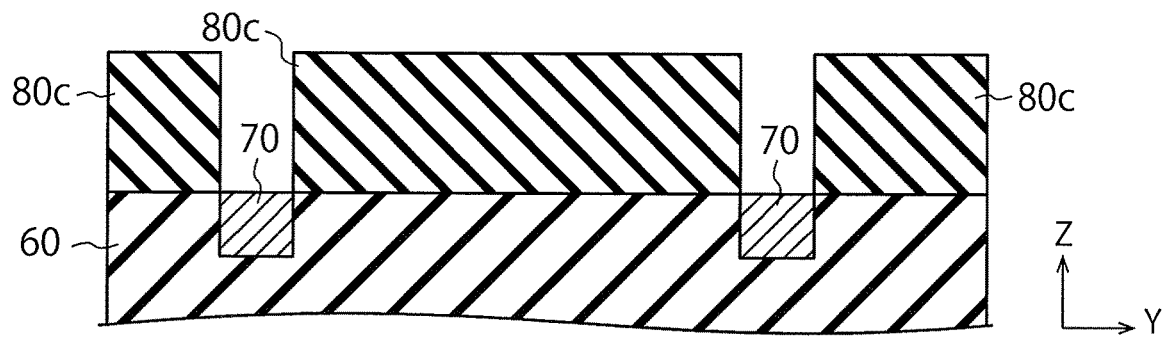
FIG. 4A is a cross-sectional view explaining a film formation step.
Figure 4B:
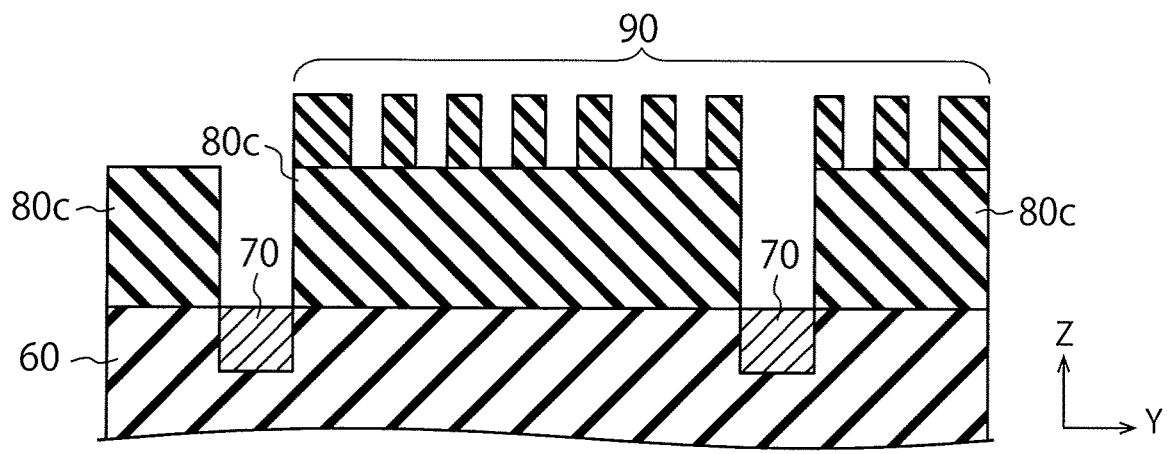
FIG. 4B is a cross-sectional view explaining a patterning step.

First, as illustrated in FIG. 4A, a nitride silicon film 80c is formed on the interlayer dielectric 60 through, for example, plasma chemical vapor deposition (CVD). Then, as illustrated in FIG. 4B, patterning is performed with a mask 90. The pattern of the mask 90 corresponds to a concave and convex pattern of the passivation film 80.

Figure 4C:
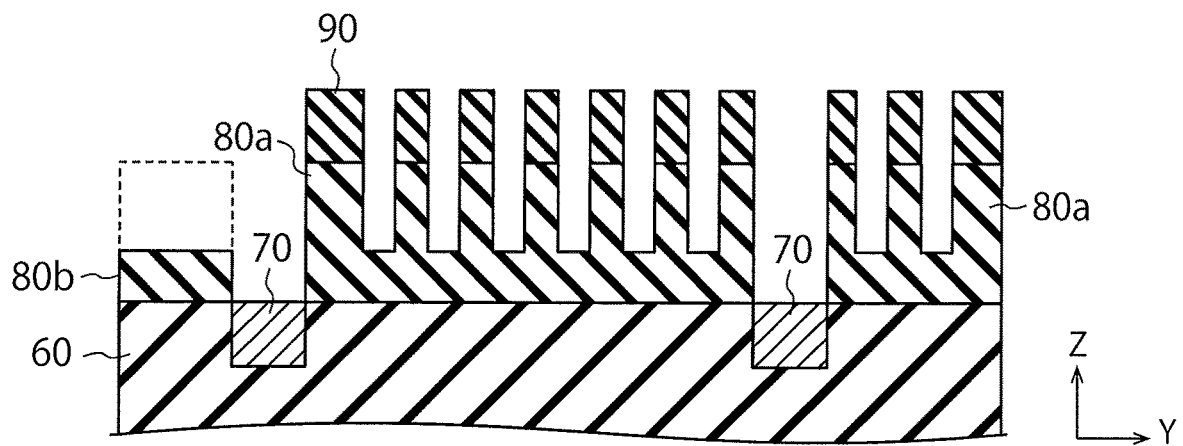
FIG. 4C is a cross-sectional view explaining an etching step.

Then, as illustrated in FIG. 4C, the nitride silicon film 80c is etched in accordance with the pattern of the mask 90 through, for example, reactive ion etching (RIE). By this means, the first portion 80a and the second portion 80b of the passivation film 80 are formed. Finally, the mask 90 is removed.

According to the present embodiment described above, a concave and convex shape is repeated in the first portion 80a of the passivation film 80 in accordance with a wiring pattern of the conductive layer 21. By this concave and convex shape, in the first portion 80a in the cell region 101, a volume in the X direction parallel to the conductive layer 21 becomes greater than a volume in the Y direction perpendicular to the conductive layer 21.

Therefore, it is possible to suppress warpage in the X direction in which greater stress occurs by presence of many conductive layers 21 by the concave and convex shape of the first portion 80a. Further, the above-described concave and convex shape is formed in the cell region 101, and is not provided in the second portion 80b of the passivation film 80 provided in the peripheral circuit region 102. Therefore, it is possible to keep an effect of suppressing warpage of the peripheral circuit region 102 with the passivation film 80.

Still further, in the present embodiment, the concave and convex shape which suppresses the above-described stress is formed on the passivation film 80 located in an uppermost layer of the semiconductor device 1. Because the passivation film 80 is a protective film of the memory film 30, the passivation film 80 is only required to secure a minimum thickness necessary for protection. Therefore, by the concave and convex shape being formed on the passivation film 80, it is possible to suppress warpage without negatively affecting characteristics of the memory film 30.

Second Embodiment

Figure 5:
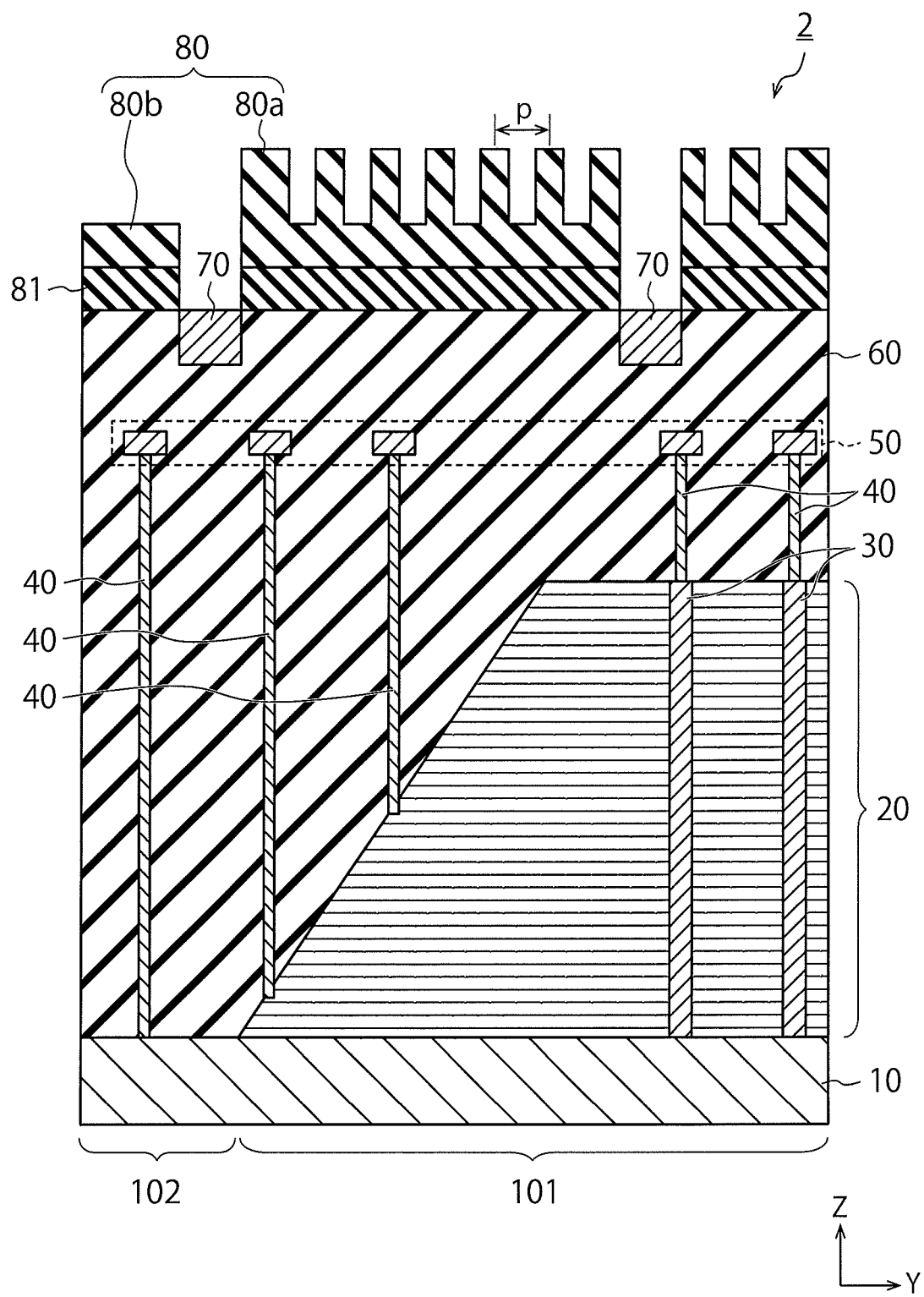
FIG. 5 is a cross-sectional view illustrating a schematic structure of a semiconductor device according to a second embodiment.

FIG. 5 is a cross-sectional view illustrating a schematic structure of a semiconductor device according to a second embodiment. The same reference numerals will be assigned to components similar to those in the above-described first embodiment, and detailed description will be omitted.

As illustrated in FIG. 5, a semiconductor device 2 according to the present embodiment includes the passivation film 80 corresponding to a first nitride film, and a passivation film 81 corresponding to a second nitride film. The passivation film 80 has the first portion 80a and the second portion 80b as described in the first embodiment. In the first portion 80a, a concave and convex shape is formed along the Y direction.

The passivation film 81 is a nitride silicon film formed between the interlayer dielectric 60 and the passivation film 80 through, for example, plasma CVD. The interlayer dielectric 60 has a function of adjusting characteristics of the memory film 30 by emitting hydrogen. Film quality of the passivation film 80 is different from film quality of the passivation film 81. That is, hydrogen content of the passivation film 80 is different from hydrogen content of the passivation film 81.

In the present embodiment, a film thickness of the passivation film 80 is specified by a volume required for alleviating stress occurring by the conductive layer 21. Meanwhile, a film thickness of the passivation film 81 is specified by an amount of hydrogen required for adjusting characteristics of the memory film 30.

According to the present embodiment described above, a concave and convex shape is formed along a wiring pattern of the conductive layer 21 on the passivation film 80 in a similar manner to the first embodiment. By this means, it is possible to suppress warpage in the X direction in which greater stress occurs by presence of the conductive layer 21.

Still further, because, in the present embodiment, the passivation film 81 is provided, it is also possible to adjust characteristics of the memory film 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   a plurality of conductive layers extending in a first direction on the semiconductor substrate, and laminated in a third direction perpendicular to the first direction and a second direction at intervals in the second direction perpendicular to the first direction; and
   a passivation film which has several layers provided above the plurality of conductive layers,
   wherein the passivation film has a first nitride film provided above the plurality of conductive layers, and a second nitride film provided on the first nitride film, and the second nitride film has the concave and convex shape which is repeated along the second direction,
   wherein the passivation film is provided in a first portion provided in a cell region in which the plurality of conductive layers are provided, and a second portion provided in a peripheral circuit region adjacent to the cell region in the first direction or the second direction, and the first portion has the concave and convex shape, and the second portion is a flat film, and
   wherein the semiconductor device further comprises a memory film which penetrates through the plurality of conductive layers in the third direction in the cell region, and the plurality of conductive layers are word lines disposed opposite to the memory film.

2. The semiconductor device according to claim 1,
   wherein hydrogen content of the first nitride film is different from hydrogen content of the second nitride film.

3. The semiconductor device according to claim 1,
   wherein a central pitch of the convex portion in the second direction is the same as a pitch of the conductive layers in the second direction.

4. The semiconductor device according to claim 1,
   wherein one of the convex portion is formed for the plurality of conductive layers.

* * * * *